(12) United States Patent   (10) Patent No.: US 8,105,649 B1
Wedding et al.              (45) Date of Patent:     Jan. 31, 2012

(54) FABRICATION OF SILICON CARBIDE SHELL

(75) Inventors: Carol Ann Wedding, Toledo, OH (US); Joe K. Cochran, Marietta, GA (US)

(73) Assignee: Imaging Systems Technology, Toledo, OH (US)

( * ) Notice: Subject to any disclaimer, the term of this patent is extended or adjusted under 35 U.S.C. 154(b) by 464 days.

(21) Appl. No.: 12/189,116

(22) Filed: Aug. 8, 2008

Related U.S. Application Data

(60) Provisional application No. 60/954,829, filed on Aug. 9, 2007.

(51) Int. Cl.
    *C23C 16/32* (2006.01)
(52) U.S. Cl. ............. 427/249.1; 427/249.4; 427/249.15
(58) Field of Classification Search .............. 427/249.1, 427/249.2, 249.4, 249.15
    See application file for complete search history.

(56) References Cited

U.S. PATENT DOCUMENTS

| | | | |
|---|---|---|---|
| 3,528,809 A | 9/1970 | Farnand et al. | |
| 4,162,914 A | 7/1979 | Cremer | |
| 4,448,900 A * | 5/1984 | Schwarz | 521/57 |
| 4,580,524 A | 4/1986 | Lackey, Jr. et al. | |
| 4,597,936 A * | 7/1986 | Kaae | 376/411 |
| 4,686,123 A * | 8/1987 | Levan | 427/424 |
| 4,775,598 A | 10/1988 | Jaeckel | |
| 4,917,857 A | 4/1990 | Jaeckel et al. | |
| 5,154,970 A | 10/1992 | Kaplan et al. | |
| 5,217,755 A | 6/1993 | Thebault et al. | |
| 5,221,355 A * | 6/1993 | Ohashi et al. | 118/725 |
| 5,248,462 A | 9/1993 | Brotz | |
| 5,283,109 A | 2/1994 | Kaplan et al. | |
| 5,300,322 A | 4/1994 | Lowden | |
| 5,348,774 A | 9/1994 | Golecki et al. | |
| 5,350,545 A | 9/1994 | Streckert et al. | |
| 5,395,572 A | 3/1995 | Brotz | |
| 5,411,763 A | 5/1995 | Weaver et al. | |
| 5,429,780 A | 7/1995 | Prin et al. | |
| 5,449,654 A | 9/1995 | Prin et al. | |
| 5,480,678 A | 1/1996 | Rudolph et al. | |
| 5,545,435 A | 8/1996 | Steffier | |
| 5,558,907 A | 9/1996 | Steffier | |
| 5,612,132 A | 3/1997 | Goela et al. | |
| 5,652,021 A | 7/1997 | Hunt et al. | |
| 5,668,188 A | 9/1997 | Whinnery et al. | |
| 5,738,908 A | 4/1998 | Rey et al. | |
| 5,744,075 A | 4/1998 | Klett et al. | |
| 5,780,157 A | 7/1998 | Tuffias et al. | |
| 5,863,604 A | 1/1999 | Hunt et al. | |

(Continued)

FOREIGN PATENT DOCUMENTS

EP            1422488      *   5/2004

OTHER PUBLICATIONS

Zhang, Hai-Feng, et al., "Helical Crystalline SiC/SiO2 Core-Shell Nanowires". Nano Letters 2002 vol. 2, No. 9 pp. 941-944.*

(Continued)

*Primary Examiner* — Bret Chen
(74) *Attorney, Agent, or Firm* — Donald K. Wedding

(57) ABSTRACT

The producing of shells of silicon carbide including CVD and CVI processes: A dense layer of silicon carbide is deposited upon the hollow shells, the shells being agitated during deposition to prevent sticking, bonding, or adhesion of shells to one another.

7 Claims, 2 Drawing Sheets

U.S. PATENT DOCUMENTS

| | | | |
|---|---|---|---|
| 5,916,633 | A | 6/1999 | Lackey et al. |
| 5,928,799 | A | 7/1999 | Sherman et al. |
| 5,935,351 | A | 8/1999 | Sherman et al. |
| 6,103,149 | A | 8/2000 | Stankiewicz |
| 6,197,374 | B1 | 3/2001 | Huttinger et al. |
| 6,206,531 | B1 | 3/2001 | Williams et al. |
| 6,251,819 | B1 | 6/2001 | Prin et al. |
| 6,582,651 | B1 | 6/2003 | Cochran et al. |
| 6,605,390 | B1 | 8/2003 | Moore et al. |
| 6,749,931 | B1 | 6/2004 | Pinneo et al. |
| 6,811,761 | B2 | 11/2004 | Brese et al. |
| 6,815,052 | B2 | 11/2004 | Pinneo |
| 6,863,938 | B2 | 3/2005 | Pinneo |
| 6,887,809 | B1 | 5/2005 | Adler |
| 6,921,707 | B1 | 7/2005 | Zinn et al. |
| 6,929,866 | B1 | 8/2005 | Williams et al. |
| 7,009,359 | B2 | 3/2006 | del Puerto |
| 7,776,255 | B1 | 8/2010 | Wedding et al. |
| 7,829,183 | B2 * | 11/2010 | Forrest et al. .......... 428/212 |
| 2001/0022408 | A1 * | 9/2001 | Goela et al. .......... 264/81 |
| 2002/0004444 | A1 | 1/2002 | Goela et al. |
| 2005/0000412 | A1 | 1/2005 | Brese et al. |
| 2005/0039885 | A1 * | 2/2005 | Vaidyanathan et al. ..... 165/80.4 |
| 2006/0051505 | A1 * | 3/2006 | Kortshagen et al. .......... 427/212 |
| 2007/0042153 | A1 * | 2/2007 | Forrest et al. ......... 428/64.1 |
| 2007/0212538 | A1 * | 9/2007 | Niu .................. 428/367 |

OTHER PUBLICATIONS

Shim, Hyun Woo, et al., "Nanowebs and nanocables of silicon carbide". Nanotechnology 18 (2007) 335607 pp. 1-5.*

Wang, Kun, et al., "Synthesis of Nanostructures Silicon Carbide Spheres from Mesoporous C-SiO2 Nanocomposites". The Royal Society of Chemistry, 2009, pp. 1-6.*

* cited by examiner

FABRICATION OF SILICON CARBIDE SHELL

RELATED APPLICATION

This application claims priority under 35 U.S.C 119(e) from Provisional Application Ser. No. 60/954,829 filed Aug. 9, 2007.

INTRODUCTION

This invention relates to the fabrication of silicon carbide shells by chemical vapor deposition (CVD) and chemical vapor infiltration (CVI) processes. Chemical vapor deposition comprises the deposition of solid phases on substrates and the decomposition of volatile or gaseous compounds which contain the solid phase elements. If this deposition takes place in the open pores of a porous substrate or in the cavities of a porous structure, then it is known as chemical vapor infiltration. Chemical vapor deposition (CVD) and/or chemical vapor infiltration (CVI) are of significance primarily with respect to the deposition and infiltration of refractory materials such as carbon, carbides, nitrides, borides, oxides, metals, and alloys (see for example W. J. Lackey, in Encyclopedia of Composites, Vol. 1, edited by Stuart M. Lee, VCH Publishers, Inc., New York, 1990, pg. 319). CVI methods allow a densification of structure or, when the porous structure consists of fibers, an introduction of a matrix and, with this, the production of composite, strengthened fiber materials.

Both chemical vapor deposition and chemical vapor infiltration are complex processes. In the chemical vapor deposition of compounds such as silicon carbide, it is difficult to attain solid phase deposition in stoichiometric compositions for larger parts in the generation of a coat of even thickness.

In chemical gas phase infiltration, the volatile or gaseous starting compounds must be transported into the depth of the pores before dissolving. If decomposition occurs on the surface of the porous structure in the pore entrances, the pores may become clogged and not filled.

BACKGROUND OF INVENTION

Various embodiments of methods for chemical vapor infiltration (CVI) are known. Procedurally the simplest to perform are methods of isobaric and isothermic chemical vapor infiltration. In this method the entice process space exists at constant temperature and pressure. Here, however, only very low pressures or partial pressures of educt gases can be used, when necessary with addition of inert or dilution gases, so that extremely long infiltration times are required.

In order to shorten the infiltration times, chemical vapor infiltration of silicon carbide uses methyltrichlorosilane (MTS) as educt gas, the educt gas being preheated to temperatures well above the decomposition temperature of MTS i.e. above about 100° C. while at the same time setting pressures up to about 25 kPa and removing silicate components from the gas phase at the outlet of the reaction zone. Preheating the MTS to such high temperatures leads to a high rate of deposition of the substances added with the gas. This achieves a high production speed but at the same time leads to uneven deposits, particularly on the surface, and to minimal pore filling. Thus optimal or maximal pore filling is more effective at extremely slow deposition or infiltration rates (e.g. W. V. Kotlensky, in Chemistry and Physics of Carbon, Vol. 9, edited by P. L. Walker and P. A. Thrower, Marcel Dekker, New York, 1973, pg. 173).

In order to successfully realize infiltration, low pressures, and particularly low partial pressures, are recommended. The pressures under the conditions of industrially applied chemical vapor infiltration are at least one to two orders of magnitude below normal pressure. Starting compounds are partially mixed with inert gases so that their partial pressure, and the deposition rate, can be further lowered. Due to the low partial pressures, extremely long infiltration times of up to several weeks are required.

Since the isobaric and isothermic methods failed in achieving rapid production and high degrees of pore filling, the development of new methods have been attempted, such as pressure gradient, temperature gradient and pressure switching methods. Such methods are for example known from Nyan-Hwa Tai and Tsu-Wei Chou, Journal of American Ceramic Society 73, 1489 (1990).

In the vacuum pressure pulsation method, the process pressure is continually varied to support the diffusion. The disadvantage of this method lies in the cost of the apparatus as well as in the filtration times which are still very long.

Another well-known method is the temperature gradient method for example, as disclosed in U.S. Pat. Nos. 5,411,763 (Weaver et al.) and 5,348,774 (Golecki et al.). In this method, heat is removed from the side of the porous substrate facing the process gas stream by suitable measures, for example by cooling by the stream. The side of the porous substrate opposite to the gas stream is adjacent to a heating element. It is in this way that a temperature gradient crucial to the method is established normal to the surface of the substrate. The surface temperature on the cold side is adjusted with the gas stream such that very little or no deposition takes place. It is in this way that narrowing of the pores in this region is avoided. The disadvantage of this method is the very high gas throughput necessary for cooling. The low yield of deposited material entails long production times. Much equipment is needed for the heating.

In a further known embodiment of CVI methods, the gas is streamed through the porous substrate with forced convection whereby a pressure gradient is established. The infiltration time can be kept relatively short. However, after a certain level of pore filling, the streaming through of the porous structure becomes more difficult.

U.S. Pat. No. 4,580,524 (Lackey et al.) discloses a CVI method whereby temperature and pressure gradient techniques are combined with one another. In this way relatively short production times can be achieved. The disadvantage of such a method is the complicated reactor construction.

The task which provided the basis for this invention is to create a CVI method by which a high level of pore filling during a pre-set production time can be achieved, or alternatively, a shorter production time achieved for pre-set pore filling levels.

Silicon carbide is useful for its very good mechanical, physical, and chemical properties including corrosion resistance, chemical stability, and temperature stability. The present invention provides a method of producing an article of manufacture that comprises silicon carbide shells. The method comprises the following major processes, 1) manufacture silicon carbide shells around polystyrene sacrificial cores, 2) providing a means of agitating the silicon carbide shells to prevent them from inadvertently bonding to one another during the chemical vapor deposition and core burn-out processes, 3) chemical vapor deposition (CVD) to deposit silicon carbide with flowing methyltriclorosilane, ($CH_3SiCl_3$) MTS in hydrogen over a substrate heated to about 100° C. to about 1400° C.

Methods for producing composite materials are disclosed in the prior art. U.S. Pat. No. 6,197,374 (Huttinger et al.) describes an isobaric and isothermic method of chemical vapor infiltration of refractory materials into a porous substrate in a reaction zone. The method comprises deposition on the porous substrate within the reaction zone, providing a linear flow of an educt gas comprising deposable material in the reaction zone at a reaction temperature and a reaction pressure that produce saturation adsorption of the deposable material onto the substrate the linear flow being adjusted to have a flow rate such that no more than 50% of the deposable material is deposited into the porous substrate. Methods for producing composite materials are disclosed in U.S. Pat. No. 6,197,374 (Huttinger et al.) incorporated herein by reference.

PRIOR ART

The following U.S. patent Nos. are incorporated herein by reference: U.S. Pat. Nos. 6,582,651 (Cochran et al.), 5,652,021 (Hunt et al.), 5,217,755 (Thebault et al.), 5,300,322 (Lowden), 5,348,774 (Golecki et al.), 5,350,545 (Streckert et al.), 5,411,763 (Weaver et al.), 5,480,678 (Rudolph et al.), 5,545,435 (Steffier), 5,558,907 (Steffier), 5,738,908 (Rey et al.), 5,744,075 (Klett et al.), 5,916,633 (Lackey et al.), 6,811,761, (Brese et al.), 5,612,132 (Goela et al), 6,206,531 (Williams et al.), 6,929,866 (Williams et al.), 6,921,707 (Zinn et al.), 6,103,149 (Stankiewicz), 5,935,351 (Sherman et al.), 5,928,799 (Sherman et al.), 5,780,157 (Tuffias et al.), 5,283,109 (Kaplan et al.), 5,154,970 (Kaplan et al.), 5,863,604 (Hunt et al.), 5,652,021 (Hunt et al.), 6,887,809 (Adler), and U.S. Patent Application Publication Nos. 2005/0000412 (Brese et al.) and 2002/0004444 (Goela et al.).

SUMMARY OF INVENTION

In accordance with this invention, there is provided a process for producing shells of silicon carbide. These shells are formed as described including the following major processes:
1. manufacture of silicon carbide shells around polyethelene sacrificial cores,
2. providing a means of agitating the silicon carbide shells to prevent the shells from bonding to one another during the chemical vapor deposition and core burn-out processes, and
3. chemical vapor deposition (CVD) to deposit silicon carbide with flowing methyltriclorosilane in hydrogen over a substrate heated from about 100° C. to about 1400° C.

The silicon carbide shells may have any beneficial shape including, but not limited to, spherical, cylindrical, conical, and dumbbell shaped, etc. Other embodiments of this invention include foam compositions comprised of other refractory or ceramic materials such carbon, carbides, nitrides, borides, oxides, metals, steel and alloys.

1) Shell Fabrication

The hollow silicon carbide shells are formed by atomizing silicon carbide powder slurries containing appropriate binders onto polystyrene beads in tumbling beds of expanded polystyrene beads to build a layer of silicon carbide powder of a desired thickness upon the shells. Subsequent thermal processing of the silicon carbide powder coated expanded polystyrene beads evaporates a sacrificial polystyrene core to produce hollow silicon carbide shells. A wide variety of materials that will sublimate or burn-out during subsequent thermal processing may be used as sacrificial cores.

Pre-Ceramic Polymers in Slurry

Pre-ceramic polymers can be added to the slurry resulting in a low firing temperature.

In this method, pre-ceramic polymers are used such as polycarbosilanes (PCS), $(Si(CH_3)2CH_2)$ as a starting material that is cross linked at about 200° C. to form rigid machineable solids. It is then pyrolyzed at about 800 ° C. to about 1000° C. to release the hydrogen leaving amorphous silicon carbide with good strength. The pyrolyzed silicon carbide has reasonably high density, but has high porosity of about 30% due to shrinkage. Repeated infiltration and pyrolysis can reduce the porosity to about 2 % to about 4%. Higher temperature annealing crystallizes the silicon carbide to nano-sized grains and a dimensional stability of about 1% is maintained.

In regards to the pre-ceramic polymers, high viscosity polycarbosilane (HVPCS) polymer are commercially available. These materials are self-supporting, soluble in several organic solvents, and respond to thermal treatment similar to the water based slurry. Thus, the silicon carbide slurry can consist of the organic solvent, fine silicon carbide powder, and the HVPCS as the binder.

Silicon Carbide Whiskers to Enhance Strength

Silicon carbide whiskers are nearly perfect fine single crystal fibers that have very high levels of useful strength. Silicon carbide whiskers are strong, highly flexible and have good heat, corrosion, and abrasion resistance, and show good thermal conductivity with low thermal expansion. Ceramics to which silicon carbide whiskers are added have double the strength and breakage resistance compared to those without silicon carbide whiskers. Thus it is desirable to mix silicon carbide whiskers with the silicon carbide-powder silicon carbide-PCP mixture in the hollow sphere fabrication process.

The silicon carbide whiskers generally require spray coating of the preforms. Silicon carbide whiskers have been successfully mixed with ceramic powders in slurries and spray coated. U.S. Pat. No. 4,594,106 (Minoru et al.), incorporated herein by reference, discloses that the concentration of needles to ceramic powder is preferably between about 3% and about 25% by weight. Whisker concentrations greater than 25% are difficult to spray. The amount of binder is added to the composition in an amount sufficient to aid the granulation of the ingredients, approximately 1 part of binder per 100 parts of composition by weight. This granulation serves to evenly disperse the ceramic whiskers and to reduce the size of the particles. It has been found that granules of about 10 μm to about 500 μm in diameter, preferably about 50 μm to about 100 μm in diameter, allows for easy spraying.

High purity silicon carbide powder with a particle size of about 1 micron to about 5 microns is mixed with the whiskers such that the whisker content will be about 5% to about 25%. The mixed solids can be incorporated into the solvent and HVPCS polymer.

Other methods and embodiments for forming silicon carbide shells include but are not limited to blowing shells into bubbles of silicon slurries and thermal processing the bubbles into silicon carbide shells.

The silicon carbide shells may have any beneficial geometric shape including, spheres, cylindrical shapes, cone shapes, multi-faceted ball shapes, and interlocking shapes (e.g., dumb bell like) or the like. The shell shape may be a multi-sided body including a base of n sides. The cross section of the shell body along any axis can be a circle, square, rectangle, triangle, pentagon, hexagon, and so forth.

2) Shell Processing

A plurality of shells manufactured in the prior step are contained in a reactor chamber within which deposition takes place, and which simultaneously subjects the shells to agitation, such that individual silicon carbide shells will not stick, bond or adhere to one another during the CVD deposition. Agitation may be imparted to the shells by means of a mechanical shaker mechanism, a rotary drum, or any other activation means. Shells may be processed as a batch within the reaction chamber, or they may be transported through the reaction chamber during the deposition process by conveyor like means.

3) CVD/CVI Deposition

CVD/CVI deposition apparatus to deposit a dense layer of silicon carbide is comprised of the following, 1) a gas delivery system for precursors to the reactor chamber, 2) a reactor chamber within which deposition takes place, 3) a substrate loading and unloading mechanism for insertion and removal of deposition substrates, 4) an energy source to provide the temperatures required for reaction of the precursors, 5) a vacuum system for the removal of all gases other than those required for the reaction, 6) an exhaust system for the removal of volatile by-products from the reaction chamber, 7) an exhaust treatment system to prevent the release of any harmful compounds into the atmosphere.

CVD/CVI deposition of silicon carbide into the porous bed of hollow shells forms a dense layer of silicon carbide deposited on the shells. This is accomplished by subjecting appropriate beds of silicon carbide shells to a chemical vapor deposition so as to deposit silicon carbide by flowing methyltriclorosilane in hydrogen over a substrate heated from about 100° C. to about 1400° C. In this temperature range, MTS will decompose by reaction (1) below to silicon carbide and will deposit dense silicon carbide on all shell surfaces. The deposition techniques do not require line-of-site deposition. Silicon carbide will be uniformly deposited on complex surfaces and into powder beds if gas phase pressure gradients (both decreasing and oscillating) are created to force the gas to flow through the bed of silicon carbide shells and in and out of the silicon carbide powder shells.

$$CH_3SiCl_3 > SiC + 3HCl \quad (1)$$

In this manner, the powder shells will be densified by chemical vapor infiltration (CVI) of the silicon carbide into the powder shell for shell bonding. At the same time, a dense layer of silicon carbide will be deposited on the shells. The amount of CVI of silicon carbide in the shell compared to CVD of silicon carbide on the exterior of the shell to build up of film thickness is controlled by process parameters within limits. The deposited layers will have strength of about 250 to about 450 MPa. Densified silicon carbide shells may be used as individual components or assembled into a continuous matrix of other materials, e.g., aerogels to form composite structures.

DETAILED DESCRIPTION OF THE DRAWINGS

Figure 1:
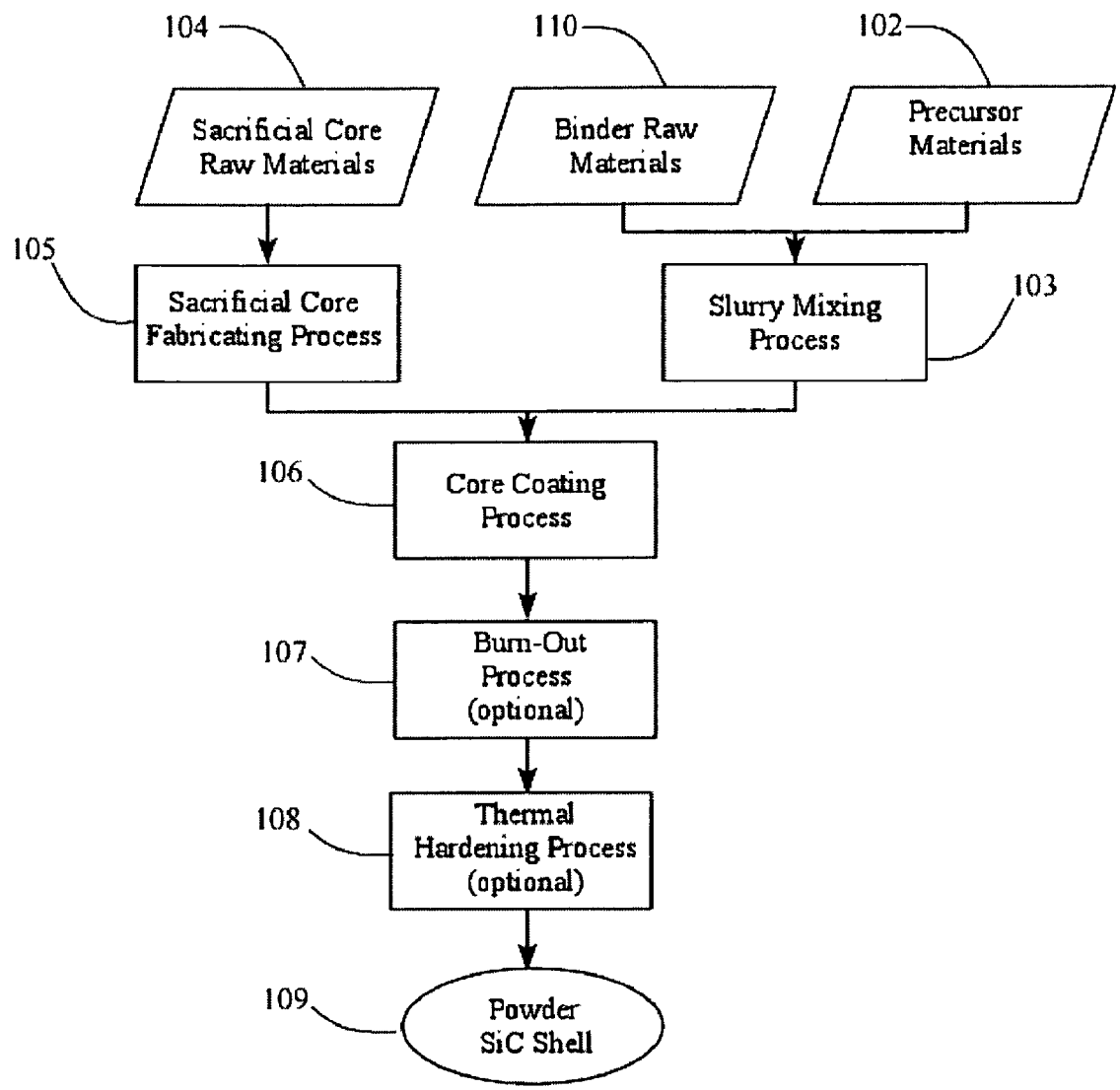
FIG. 1 shows a method and process flow chart for producing silicon carbide shells.

FIG. 1 shows the manufacturing process for producing silicon carbide shells that allows control of shell thickness, size, and allows for a variety of shapes. The manufacturing process is flexible and adaptive to meet a wide range of silicon carbide shell product requirements. It provides for customized production of silicon carbide shell size, shape, and, composition. A sacrificial core fabrication process 105 provides a method of customizing the size and shape of the silicon carbide shell. In this process 105 suitable core raw materials 104 are formed into a sacrificial core, Suitable core raw materials 104 are those that are generally composed of organic compounds, that completely pyrolize at a low temperature, and do not react detrimentally with the shell materials during pyrolization. Suitable core materials include polyethylene, polystyrene, and micro-crystalline cellulose. Suitable methods for shaping the sacrificial core include prilling, pressing, or steam expansion. A prilling process produces substantially round cores the diameter of which can be controlled through selection of process parameters. Core pressing allows for a variety of shapes and sizes including right circular cylinders and hexagonal cylinders, and multi-faceted shapes such as, but not limited to, cones, cubes, and pyramids. Other methods of core fabrication are also contemplated. In addition to providing customization of size and shape, the contemplated sacrificial core fabrication process has sufficient control to allow the fabrication of sacrificial cores that are highly uniform in size, weight, and shape with a smooth surface finish. Because the sacrificial core acts as a substrate for the slurry, a highly uniform preform allows for a highly uniform defect free coating later in the process, which provides high-quality, high-yield hollow silicon carbide shells.

The slurry mixing process 103 provides a method of customizing material properties for strength, electro-conductivity, and chemical resistance of the hollow silicon carbide shell.

The organic binders 110, which are contained as solutes in a solution may be selected from a large number of polymers including organic polymers selected from the group consisting of polyethylene, polyacrylate, polyvinyl acetate, polyvinyl alcohol, polyvinyl chloride, polybutyrate, polyamide, cellulose ester, phenol resin, amino resin, and epoxy resins. Particularly suitable binders include polyacrylates and cellulose esters. Other materials include alginates, gums, vinyls (polyvinyl alcohol), starches, acrylics, acrylamides, dextrins, and cellulose derivatives such as methylcellulose, hydroxyethylcellulose, and hydroxypropoyl methylcellulose. The solution may be aqueous. A suitable aqueous dispersion may have a binder content from about 3% to about 15% by weight relative to the weight of the powder material contained in the dispersion.

The apparent density of a silicon carbide shell composed of a given metal or silicon carbide is controlled in the core coating process 106. In this process, the selected metal oxide slurry is applied to the sacrificial cores. Suitable coating methods include, but are not limited to, spraying, pan coating, and fluidized beds. In this process the thickness of the shell may be controlled to customize the density. The density of the shell also affects the strength and the cost of the silicon carbide shell. By selecting the preform coating deposition time to deposit a wall thickness of about 20 μm to about 800 μm as part of the manufacturing coating process 106, hollow silicon carbide shell wall thickness may be produced over a wide range as part of the flexible manufacturing process. Wall thickness directly impacts hollow silicon carbide shell density and strength. Changes in the wall thickness provide for customizing both hollow metal or silicon carbide shell properties. An even coat is achieved by selecting a slurry composition that wets evenly over the preform and dries quickly. Many thin coats will improve the uniformity, density, and manufacturing yield of the hollow silicon carbide. The duration of the core coating process will depend on the coating thickness desired and the temperature of the fluidizing gas, which is at a temperature between about 70° C. and about 120° C. The application and drying of the coating are generally completed within a time of about 1 to about 3 hours.

The burn-out process 107 provides a method of pyrolizing the sacrificial core and other organics, leaving a metal oxide shell in a bisque "green" state. The burn-out process may occur in an inert, reducing, or oxidizing atmosphere. The choice of atmosphere is based, in part, on the organic material present in the bisque state and metal oxides present in the bisque state. A sufficient burn-out temperature is usually below about 900° C.

In the hardening process 108, the precursor is strengthened through heating in an appropriate atmosphere to produce completed hollow porous silicon carbide shells 109 to be increased in density in subsequent CVI deposition of silicon carbide to produce strong high density hollow silicon carbide shells. The hardening process does not produce full density nor hardness of the silicon carbide material, but provides an optimum porous silicon carbide substrate to support subsequent CVI densification. In certain circumstances when the temperatures used for the CVI/CVD are sufficiently high, processes 107 and 108 may be deferred and performed as part of the CVI thermal processing.

Figure 2:
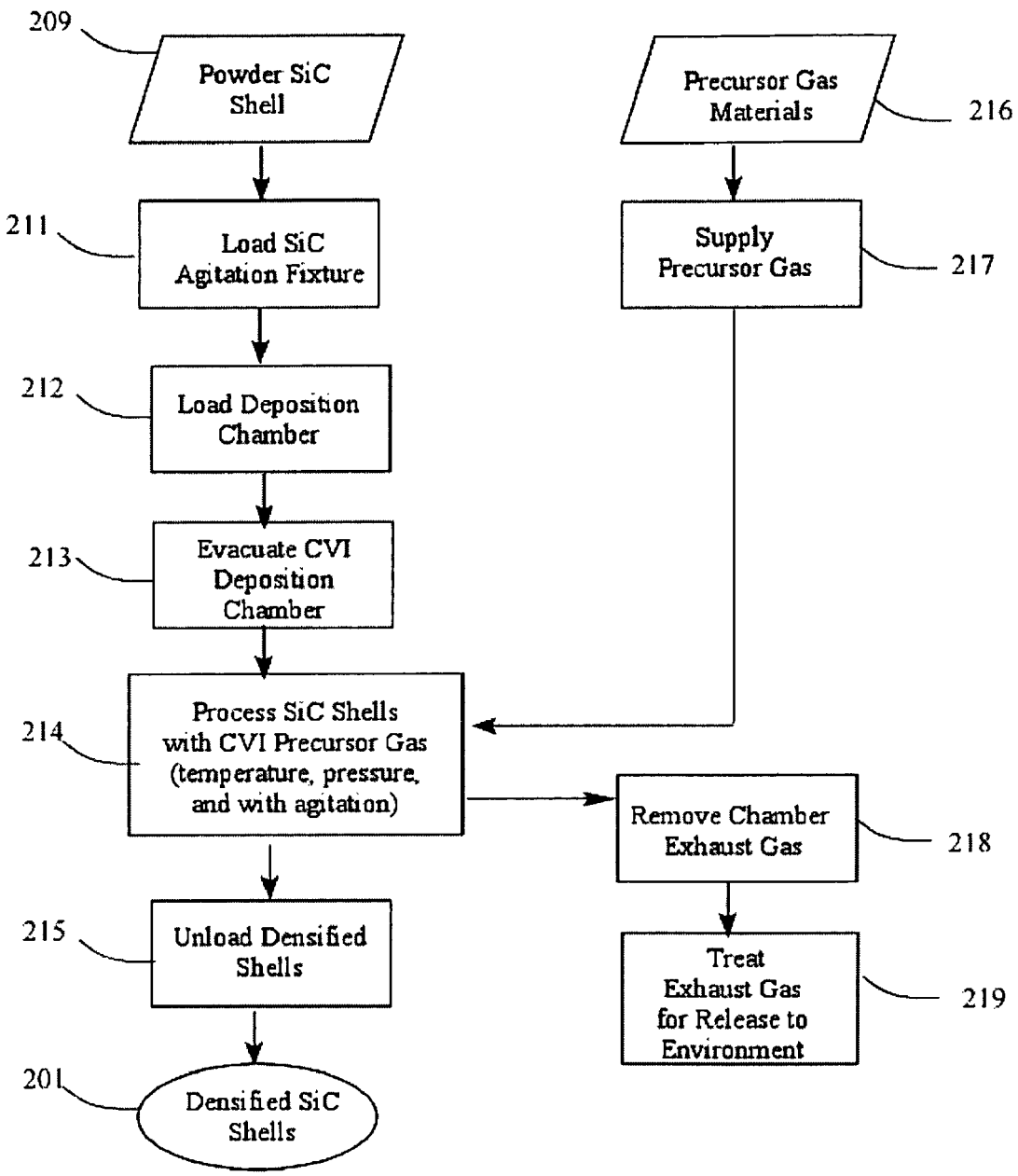
FIG. 2 shows a method and process for producing dense silicon carbide shells.

FIG. 2 shows the manufacturing process for producing high strength silicon carbide shells by CVI infiltration and deposition of silicon carbide into a bed of silicon carbide shells. CVI infiltration and deposition imbeds high strength silicon carbide into the silicon carbide shells comprising the bed to produce shells of low density properties, high strength mechanical properties, high thermal conductivity properties, high electrical conductivity properties, high mechanical strength at high temperature, high chemical, and corrosion resistance. The manufacturing process is flexible and is adaptable to meet a wide range of silicon carbide shell requirements including diameter and shell thickness.

The first step of the manufacturing process 211 is to load silicon carbide shells 209 into an agitation fixture that serves to agitate the silicon carbide shells relative to one another during the CVI deposition process so as to prevent sticking, bonding or adhesion between the shells. Numerous mechanical and electrical devices may be used to perform the agitation function including electromechanical shakers, ultrasonic shakers, rotating drum devices, etc. The agitation device may be inside the deposition chamber, but must not interfere with the equipment or the CVI deposition process, must not generate debris or contamination products, and should preferably have vibration isolation from the vacuum chamber. The second step of the manufacturing process 212 is to load the agitation fixture into an appropriate vacuum deposition chamber such that precursor gas for CVI deposition will flow into and through the silicon carbide shells contained in the fixture. The third step of the manufacturing process 213 is to evacuate the deposition chamber containing the fixture and silicon carbide shells so as to remove all materials from the deposition that may contaminate the silicon carbide material that is to be CVI deposited. The fourth step of the manufacturing process 214 is the CVI infiltration/deposition of silicon carbide performed at appropriate conditions of temperature and pressure in the presence of precursor supply gases including methyltriclorosilane and hydrogen precursor materials 216. Here the silicon carbide powder shells are densified by chemical vapor infiltration (CVI) and chemical vapor deposition (CVD) of the silicon carbide into the powder shell. The amount of CVI in the shell compared to CVD of silicon carbide on the exterior of the shell to build up film thickness is controlled by process parameters within limits. During and after the CVI infiltration process, waste exhaust gasses are removed from the chamber in waste removal process 218 which is followed by exhaust gas treatment process 219 that cleans the exhaust of chemical residue that may cause environmental pollution. The fifth step of the manufacturing process 214 is the removal of the finished net shape silicon carbide from the deposition chamber and the fixture.

The manufacturing process may be performed as a batch process. However, if the deposition chamber is equipped with appropriate vacuum ports, the process may be made more or less continuous.

The process described in FIG. 1 for the production of powder shells contains two optional processes, a burn-out process 107 and a thermal hardening process 108, that are designed to eliminate the sacrificial core material and harden the shell respectively. If the CVI infusion/deposition temperature is sufficiently high, the burn-out processes are performed during the CVI process, thereby eliminating the need for earlier shell processes 107 and/or 108.

Other embodiments of methods described herein for the practice of this invention include processing of most refractory metal and metalloid materials including but not limited to boride compositions, oxide compositions, carbon compositions, metal/metalloid compositions, alloy compositions, and steel compositions to produce hollow shell articles of manufacture.

In one embodiment, the hollow shells are hermetically sealed with a gas inside the shell. Examples of gas include air, hydrogen, oxygen, rare gases, $CO_2$, CO, nitrogen, and so forth. In another embodiment the hollow shells are formed of silicon carbide whiskers. In another embodiment the shells are formed using a pre-ceramic polymer precursor.

SUMMARY

The foregoing description of various preferred embodiments of the invention has been presented for purposes of illustration and description. It is not intended to be exhaustive or to limit the invention to the precise forms disclosed. Obvious modifications or variations are possible in light of the above teachings. The embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims to be interpreted in accordance with the breadth to which they are fairly, legally, and equitably entitled.

The invention claimed is:

1. A method of producing hollow silicon carbide shells which comprises:
   forming hollow silicon carbide shells, and
   depositing a dense layer of silicon carbide through chemical vapor deposition upon the hollow shells, the shells being agitated during deposition to prevent sticking, bonding, or adhesion of shells to one another.

2. The invention of claim 1 wherein layers of dense silicon carbide are deposited on a bed of hollow silicon carbide powder shells.

3. The invention of claim 1 wherein the silicon carbide shells are formed by atomizing silicon carbide powder slurries containing appropriate binders into tumbling beds of expanded polystyrene beads to build up hollow powder shells of desired thickness.

4. The invention of claim 1 wherein the chemical vapor deposition of the silicon carbide comprises flowing methyltriclorosilane in hydrogen over a substrate heated from about 100° C. to about 1400° C.

5. The invention of claim 4 wherein the methyltriclorosilane decomposes at a selected temperature to silicon carbide and deposits dense silicon carbide on all surfaces.

6. The invention of claim 1 wherein the hollow powder shells are densified by chemical vapor infiltration of silicon carbide into the shells.

7. The invention of claim 1 wherein a dense layer of silicon carbide is deposited on the shells.

* * * * *